United States Patent
Bushnell

(10) Patent No.: US 12,228,973 B2
(45) Date of Patent: Feb. 18, 2025

(54) ELECTRONIC DEVICES HAVING DISPLAYS WITH EXPANDED EDGES

(71) Applicant: Apple Inc., Cupertino, CA (US)

(72) Inventor: Tyler S. Bushnell, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/488,907

(22) Filed: Oct. 17, 2023

(65) Prior Publication Data

US 2024/0045475 A1   Feb. 8, 2024

Related U.S. Application Data

(63) Continuation of application No. 17/896,531, filed on Aug. 26, 2022, now Pat. No. 11,829,205, which is a
(Continued)

(51) Int. Cl.
  *G06F 1/16* (2006.01)
  *G04G 17/04* (2006.01)
  (Continued)

(52) U.S. Cl.
  CPC ......... *G06F 1/1652* (2013.01); *G04G 17/045* (2013.01); *G04G 17/08* (2013.01);
  (Continued)

(58) Field of Classification Search
  CPC ...... G06F 1/1652; G06F 1/163; G06F 3/0412; G06F 3/044; H10K 50/84;
  (Continued)

(56) References Cited

U.S. PATENT DOCUMENTS

| | | |
|---|---|---|
| 4,349,817 A | 9/1982 | Hoffman et al. |
| 4,534,813 A | 8/1985 | Williamson et al. |

(Continued)

FOREIGN PATENT DOCUMENTS

| | | |
|---|---|---|
| CN | 102683384 A | 9/2012 |
| CN | 103828334 A | 5/2014 |

(Continued)

OTHER PUBLICATIONS

Jihhyeon Yi et al., Effects of display curvature and hand length on smartphone usability, Proceedings of the Human Factors and Ergonomics Society 2017 Annual Meeting, Dec. 2017, pp. 1054-1057, Human Factors and Ergonomics Society.

(Continued)

*Primary Examiner* — Kenneth B Lee, Jr.
(74) *Attorney, Agent, or Firm* — Treyz Law Group, P.C.; G. Victor Treyz; Kendall P. Woodruff

(57) ABSTRACT

An electronic device may be provided with a display. The display may have a flexible display layer covered by a protective display cover layer. The flexible display layer may be an organic light-emitting diode display layer or other layer with a flexible substrate. The flexible display layer may have a central region with peripheral edges. The central region may be rectangular, may be octagonal, or may have other shapes. Strip-shaped protrusions may extend along each of the peripheral edges of the central region. The strip-shaped protrusions may be bent to provide the protrusions with curved surface profiles. The display cover layer may have a cushion shape with bowed edges that overlap parts of the strip-shaped protrusions, may have curved inner and outer surfaces and/or planar surfaces, may have rounded corners with compound curvature, may have edges with curved surface profiles, and/or may have other configurations.

20 Claims, 14 Drawing Sheets

Related U.S. Application Data continuation of application No. 17/365,830, filed on Jul. 1, 2021, now Pat. No. 11,442,505, which is a continuation of application No. 16/390,850, filed on Apr. 22, 2019, now Pat. No. 11,054,861.

(60) Provisional application No. 62/683,328, filed on Jun. 11, 2018.

(51) Int. Cl.

| | | |
|---|---|---|
| *G04G 17/08* | (2006.01) | |
| *G06F 3/041* | (2006.01) | |
| *G06F 3/044* | (2006.01) | |
| *H04B 1/3827* | (2015.01) | |
| *H10K 50/84* | (2023.01) | |
| *H10K 102/00* | (2023.01) | |

(52) U.S. Cl.
CPC ............ *G06F 1/163* (2013.01); *G06F 3/0412* (2013.01); *G06F 3/044* (2013.01); *H04B 1/385* (2013.01); *H10K 50/84* (2023.02); *H04B 2001/3861* (2013.01); *H10K 2102/311* (2023.02)

(58) Field of Classification Search
CPC ........... H10K 2102/311; G04G 17/045; G04G 17/08; H04B 1/385; H04B 2001/3861
See application file for complete search history.

(56) References Cited

U.S. PATENT DOCUMENTS

| | | | |
|---|---|---|---|
| 5,329,386 A | | 7/1994 | Birecki et al. |
| 5,502,457 A | | 3/1996 | Sakai et al. |
| 5,659,378 A | | 8/1997 | Gessel |
| 6,046,730 A | | 4/2000 | Bowen et al. |
| 6,407,785 B1 | | 6/2002 | Yamazaki |
| 6,467,922 B1 | | 10/2002 | Blanc et al. |
| 6,680,761 B1 | | 1/2004 | Greene et al. |
| 6,845,190 B1 | | 1/2005 | Smithwick et al. |
| 7,228,051 B2 | | 6/2007 | Cok et al. |
| 7,542,209 B2 | | 6/2009 | McGuire, Jr. |
| 7,823,309 B2 | | 11/2010 | Albenda |
| 7,856,161 B2 | | 12/2010 | Tabor |
| 8,045,270 B2 | | 10/2011 | Shin et al. |
| 8,723,824 B2 | | 5/2014 | Myers et al. |
| 8,824,779 B1 | | 9/2014 | Smyth |
| 8,976,324 B2 | | 3/2015 | Yang et al. |
| 9,268,068 B2 | | 2/2016 | Lee |
| 9,312,517 B2 | | 4/2016 | Drzaic et al. |
| 9,342,105 B2 | | 5/2016 | Choi et al. |
| 9,509,939 B2 | | 11/2016 | Henion et al. |
| 9,568,800 B1 * | | 2/2017 | Sprague ............. G02F 1/16753 |
| 9,591,765 B2 | | 3/2017 | Kim et al. |
| 9,755,004 B2 | | 9/2017 | Shieh et al. |
| 9,818,725 B2 | | 11/2017 | Bower et al. |
| 9,880,157 B2 * | | 1/2018 | Levak ............. G01N 33/56966 |
| 9,907,193 B2 | | 2/2018 | Lee et al. |
| 10,016,161 B2 * | | 7/2018 | Townsend ............. A61B 5/742 |
| 10,048,532 B2 | | 8/2018 | Powell et al. |
| 10,052,831 B2 | | 8/2018 | Welker et al. |
| 11,442,505 B2 | | 9/2022 | Bushnell |
| 2006/0016448 A1 | | 1/2006 | Ho |
| 2007/0097108 A1 | | 5/2007 | Brewer |
| 2007/0280056 A1 | | 12/2007 | Guyot |
| 2008/0144174 A1 | | 6/2008 | Lucente et al. |
| 2008/0186252 A1 | | 8/2008 | Li |
| 2010/0177261 A1 | | 7/2010 | Jin et al. |
| 2010/0238090 A1 | | 9/2010 | Pomerantz et al. |
| 2011/0025594 A1 | | 2/2011 | Watanabe |
| 2011/0057861 A1 | | 3/2011 | Cok et al. |
| 2011/0102300 A1 | | 5/2011 | Wood et al. |
| 2011/0242686 A1 | | 10/2011 | Watanabe |
| 2012/0218219 A1 | | 8/2012 | Rappoport et al. |
| 2012/0243151 A1 | | 9/2012 | Lynch |
| 2013/0081756 A1 | | 4/2013 | Franklin et al. |
| 2013/0083080 A1 | | 4/2013 | Rappoport et al. |
| 2013/0235560 A1 | | 9/2013 | Etienne et al. |
| 2013/0279088 A1 | | 10/2013 | Raff et al. |
| 2014/0037257 A1 | | 2/2014 | Yang et al. |
| 2014/0049500 A1 | | 2/2014 | Chen et al. |
| 2014/0055702 A1 | | 2/2014 | Park et al. |
| 2014/0073486 A1 | | 3/2014 | Ahmed et al. |
| 2014/0092028 A1 | | 4/2014 | Prest et al. |
| 2014/0092346 A1 | | 4/2014 | Yang et al. |
| 2014/0183473 A1 | | 7/2014 | Lee et al. |
| 2014/0240985 A1 | | 8/2014 | Kim et al. |
| 2014/0328041 A1 | | 11/2014 | Rothkopf et al. |
| 2014/0354920 A1 | | 12/2014 | Jang et al. |
| 2015/0093087 A1 | | 4/2015 | Wu |
| 2015/0227227 A1 | | 8/2015 | Myers et al. |
| 2016/0056526 A1 | | 2/2016 | Li et al. |
| 2016/0231784 A1 | | 8/2016 | Yu et al. |
| 2016/0234362 A1 | | 8/2016 | Moon et al. |
| 2016/0367187 A1 | | 12/2016 | Ahmed et al. |
| 2017/0235341 A1 | | 8/2017 | Huitema et al. |
| 2017/0273050 A1 | | 9/2017 | Levak et al. |
| 2017/0294495 A1 | | 10/2017 | Shyu et al. |
| 2018/0052312 A1 | | 2/2018 | Jia et al. |
| 2018/0088416 A1 | | 3/2018 | Jiang et al. |
| 2018/0372958 A1 | | 12/2018 | Karafin et al. |
| 2019/0073001 A1 | | 3/2019 | Kim et al. |

FOREIGN PATENT DOCUMENTS

| | | |
|---|---|---|
| CN | 104885036 A | 9/2015 |
| CN | 105531660 A | 4/2016 |
| CN | 105579949 A | 5/2016 |
| CN | 105789255 A | 7/2016 |
| CN | 106445097 A | 2/2017 |
| CN | 106648422 A | 5/2017 |
| KR | 20180034832 A | 4/2018 |
| WO | 2017155339 A1 | 9/2017 |

OTHER PUBLICATIONS

Zheng Ning et al., Shape memory polymers for flexible electronics, Science in China: Physics, Mechanics and Astronomy, Jan. 2016, pp. 044602-2-044602-10, vol. 46, No. 4, Solid Mechanics.

* cited by examiner

ELECTRONIC DEVICES HAVING DISPLAYS WITH EXPANDED EDGES

This application is a continuation of U.S. patent application Ser. No. 17/896,531, filed Aug. 26, 2022, which is a continuation of U.S. patent application Ser. No. 17/365,830, filed Jul. 1, 2021, now U.S. Pat. No. 11,442,505, which is a continuation of U.S. patent application Ser. No. 16/390,850, filed Apr. 22, 2019, now U.S. Pat. No. 11,054,861, which claims the benefit of provisional patent application No. 62/683,328, filed Jun. 11, 2018, all of which are hereby incorporated by reference herein in their entireties.

FIELD

This relates generally to electronic devices, and, more particularly, to electronic devices with displays.

BACKGROUND

Electronic devices such as cellular telephones, tablet computers, and other electronic equipment may include displays for presenting images to a user.

If care is not taken, electronic devices with displays may not have a desired appearance or may be difficult to use satisfactorily. For example, displays may be bulky and unattractive or may not accommodate a desired electronic device shape.

SUMMARY

An electronic device may be provided with a display. The display may have a flexible display layer covered by a protective display cover layer. The flexible display layer may be an organic light-emitting diode display layer or other layer with a flexible substrate. The display cover layer may be formed from a layer of glass, clear polymer, or other protective material.

The flexible display layer may have a central region with peripheral edges. The central region may be rectangular, may be octagonal, or may have other shapes. Strip-shaped protrusions may extend along each of the edges of the central region. The strip-shaped protrusions may be bent downwardly so that the protrusions have curved surface profiles.

The display cover layer, which may be formed from a layer of glass, clear polymer, or other protective material may have a cushion shape with edges that bow outwardly to partially overlap the strip-shaped protrusions. The display cover layer may have curved inner and outer surfaces and/or planar surfaces, may have rounded corners with compound curvature, may have edges with curved surface profiles, and/or may have other configurations.

Housing structures may overlap gaps formed at corners of the central region. The housing structures may be formed from opaque material such as metal and may help block the corners from view from the exterior of the electronic device.

Inactive tail portions of the flexible display may extend from the strip-shaped protrusions and may overlap each other on a rear portion of the display layer where signal paths in the inactive tail portions are coupled to display driver circuitry.

DETAILED DESCRIPTION

Electronic devices may be provided with displays. The displays may have curved surfaces. For example, a display may have a rectangular shape with rounded corners and edges with curved profiles. Electronic device displays with curved surfaces may have an attractive appearance, may be viewed from a variety of different angles, and may have a desirably large area available for displaying images.

Figure 1:
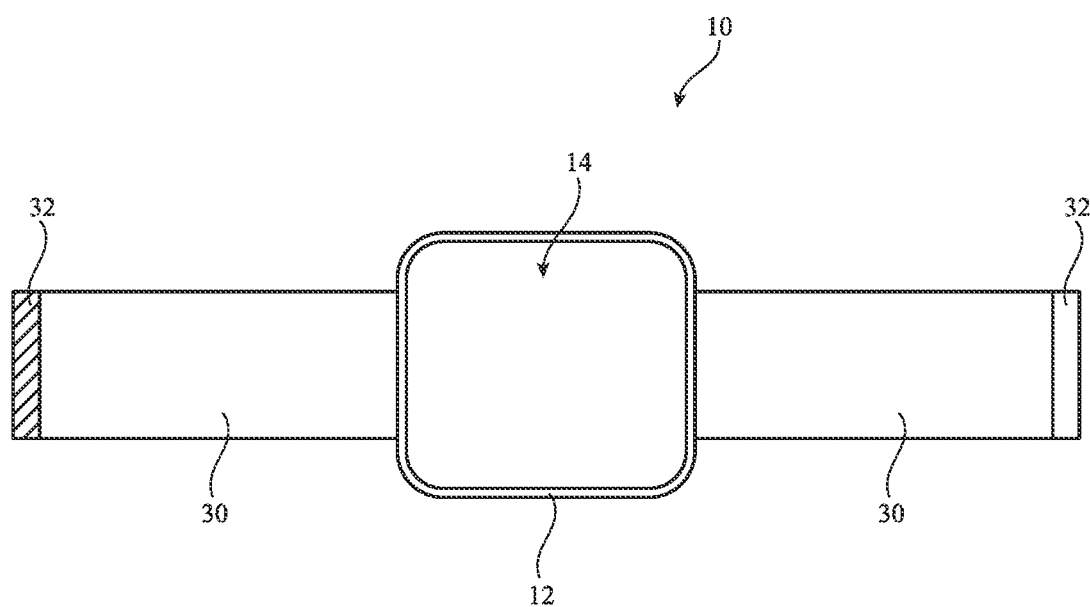
FIG. 1 is a top view of an illustrative electronic device in accordance with an embodiment.
Figure 2:
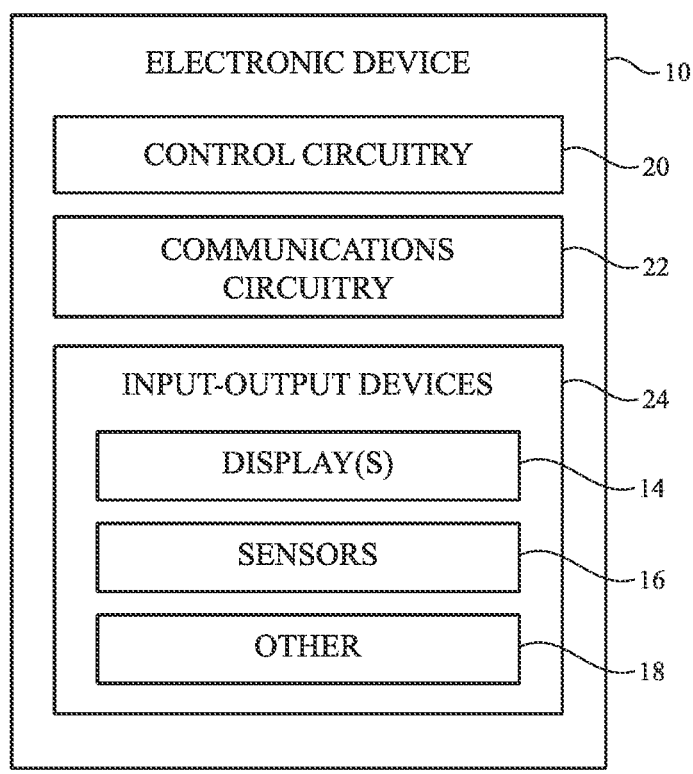
FIG. 2 is schematic diagram of an illustrative electronic device in accordance with an embodiment.

A top view of an illustrative electronic device with a display is shown in FIG. 1. As shown in FIG. 1, device 10 may have a display such as display 14 mounted in housing 12. Housing 12, which may sometimes be referred to as an enclosure or case, may be formed of plastic, glass, ceramics, fiber composites, metal (e.g., stainless steel, aluminum, titanium, gold, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

If desired, a strap such as strap 30 or other external structures may be coupled to housing 12 (e.g., using spring bars, magnets, threaded fasteners, clips, or other coupling structures). Strap 30 may be a wrist strap with a clasp such as clasp 32 that is configured to allow device 10 to be worn by a user. Strap 30 may be formed from metal, fabric, natural materials such as leather, polymer, or other materials. Clasp 32 may be a magnetic clasp, a mechanical clasp, or other suitable clasp. Device 10 may be a wristwatch that is worn on a user's wrist or other wearable device. If desired, device 10 may be a cellular telephone, tablet computer, desktop computer, display device, or other suitable equipment including a display. The use of display 14 in a wearable portable device such as a wristwatch device is sometimes described herein as an example.

Display 14 may be a liquid crystal display, an organic light-emitting diode display having an array of thin-film organic light-emitting diode pixels on a flexible substrate, or a display based on other display technologies (e.g., an electrophoretic display, a display having an array of crystalline semiconductor light-emitting diodes on a flexible substrate, etc.). Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive.

Display 14 may include one or more layers of transparent protective material. For example, the outermost layer of display 14, which may sometimes be referred to as a display cover layer, may be formed from a hard transparent material such as glass, rigid polymer, sapphire or other crystalline material, or other clear material to help protect display 14 from damage.

A schematic diagram of electronic device 10 is shown in FIG. 1. Device 10 may include control circuitry 20. Control circuitry 20 may include storage and processing circuitry for supporting the operation of device 10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 20 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc.

To support communications between device 10 and external equipment, control circuitry 20 may communicate using communications circuitry 22. Circuitry 22 may include antennas, wireless transceiver circuitry such as radio-frequency transceiver circuitry, and other wireless communications circuitry and/or wired communications circuitry. Circuitry 22, which may sometimes be referred to as control circuitry and/or control and communications circuitry, may support bidirectional wireless communications between device 10 and external equipment over a wireless link (e.g., circuitry 22 may include radio-frequency transceiver circuitry such as wireless local area network transceiver circuitry configured to support communications over a wireless local area network link, near-field communications transceiver circuitry configured to support communications over a near-field communications link, cellular transceiver circuitry such as cellular telephone transceiver circuitry configured to support voice and/or data communications over a cellular telephone link, or transceiver circuitry configured to support communications over any other suitable wired or wireless communications link). Wireless communications may, for example, be supported over a Bluetooth® link, a WiFi® link, a 60 GHz link or other millimeter wave link, a cellular telephone link handling voice and/or data, or other wireless communications link. Device 10 may, if desired, include power circuits for transmitting and/or receiving wired and/or wireless power and may include batteries or other energy storage devices. For example, device 10 may include a coil and rectifier to receive wireless power that is provided to circuitry in device 10.

Device 10 may include input-output devices such as devices 24. Input-output devices 24 may be used in gathering user input, in gathering information on the environment surrounding the user, and/or in providing a user with output. During operation, control circuitry 20 may use sensors and other input devices in devices 24 to gather input and can control output devices in devices 24 to provide desired output.

Devices 24 may include one or more displays such as display 14. Display 14 may have an array of pixels configured to display images for a user. The display pixels may be formed on a substrate such as a flexible substrate (e.g., display 14 may be formed from a flexible display panel). Conductive electrodes for a capacitive touch sensor in display 14 and/or an array of indium tin oxide electrodes or other transparent conductive electrodes overlapping display 14 may be used to form a two-dimensional capacitive touch sensor for display 14 (e.g., display 14 may be a touch sensitive display).

Sensors 16 in input-output devices 24 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into display 14, a two-dimensional capacitive touch sensor overlapping display 14, and/or a touch sensor that forms a button, trackpad, or other input device not associated with a display), and other sensors. If desired, sensors 16 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 16 and/or other input-output devices to gather user input (e.g., buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.).

If desired, electronic device 10 may include additional components (see, e.g., other devices 18 in input-output devices 24). The additional components may include haptic output devices, audio output devices such as speakers, light producing output devices such as light-emitting diodes for status indicators, light sources such as light-emitting diodes (e.g., crystalline semiconductor light-emitting diodes) that illuminate portions of a housing, gaps in displays, and/or other display structures, other optical output devices, and/or other circuitry for gathering input and/or providing output. Device 10 may also include a battery or other energy storage device, connector ports for supporting wired communication with ancillary equipment and for receiving wired power, and other circuitry.

Figure 3:
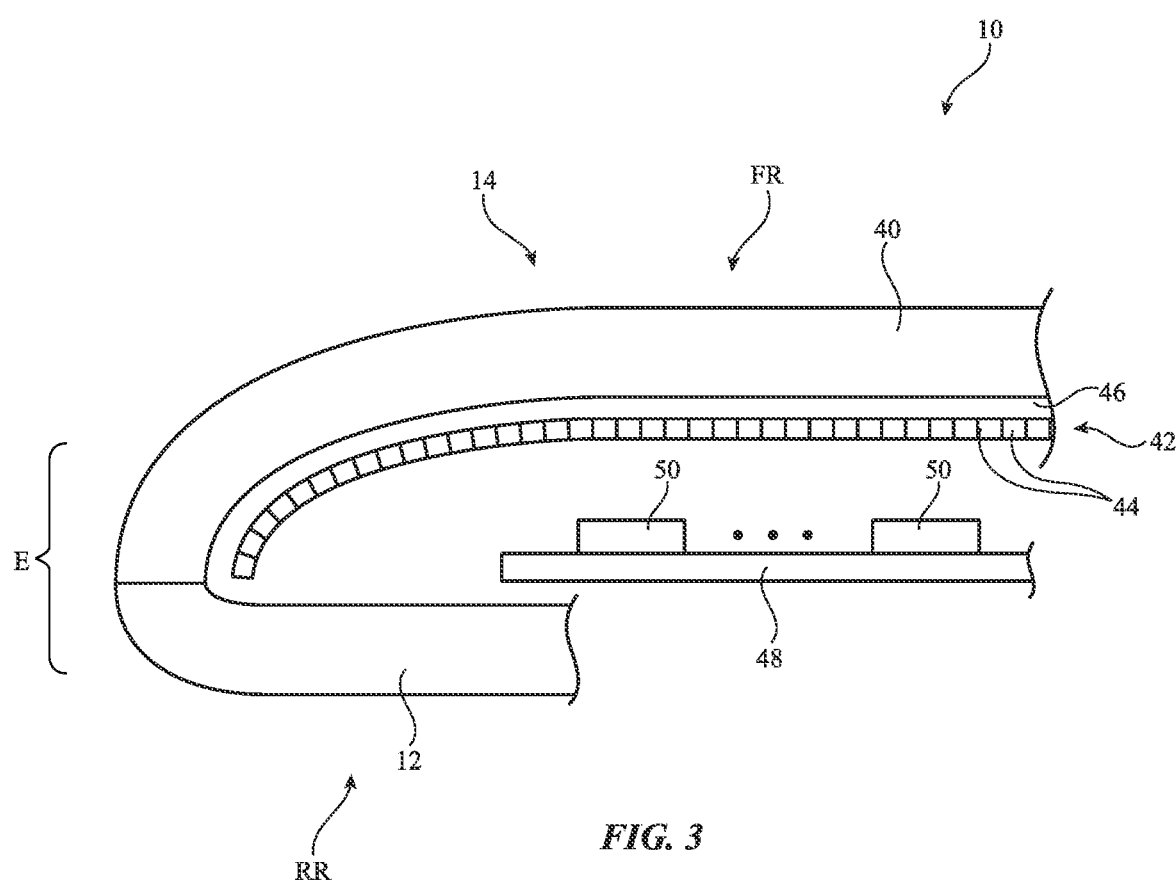
FIG. 3 is a cross-sectional side view of portion of a display and internal components in an illustrative electronic device in accordance with an embodiment.

A cross-sectional side view of an edge portion of an illustrative display and associated internal components in device 10 is shown in FIG. 3. As shown in FIG. 3, the interior of device 10 may include one or more printed circuit such as printed circuit 48 with electrical components 50. Components 50 may include integrated circuits (e.g., control circuitry 20, communications circuitry 22), input-output devices 24 such as sensors 16 and devices 18, and other circuitry.

As shown in the illustrative configuration of FIG. 3, display 14 may be mounted on front face FR of device 10 and housing 12 may be formed on opposing rear face RR of device 10. Housing 12 and/or portions of display 14 may form sidewall portions of device 10 such as sidewall E.

Display 14 may include a flexible display layer such as flexible display layer 42 having an array of pixels 44 on a flexible substrate (e.g., a polyimide substrate or other flexible polymer layer). Pixels 44 may be crystalline semiconductor light-emitting diode pixels or pixels formed thin-film organic light-emitting diodes and other thin-film circuitry. Display layer 42 may be covered with a transparent protective layer such as display cover layer 40. Display cover layer 40 may be formed from glass, polymer, crystalline material such as sapphire, or other transparent material and/or combinations of these materials. A layer of adhesive (polymer) such as layer 46 may be used to attach display layer 42 to the inner surface of display cover layer 40, if desired. In some configurations, an internal frame structure may be provided to support some or all of display layer 42 (e.g., from the underside of layer 42).

In the example of FIG. 3, display cover layer 40 has inner and outer surfaces with curved profiles. If desired, the surfaces of display cover layer 40 may include planar portions (e.g., flat areas associated with the center of front face FR, vertical sidewall portions on sidewall E, etc.). The configuration of FIG. 3 is illustrative.

Figure 4:
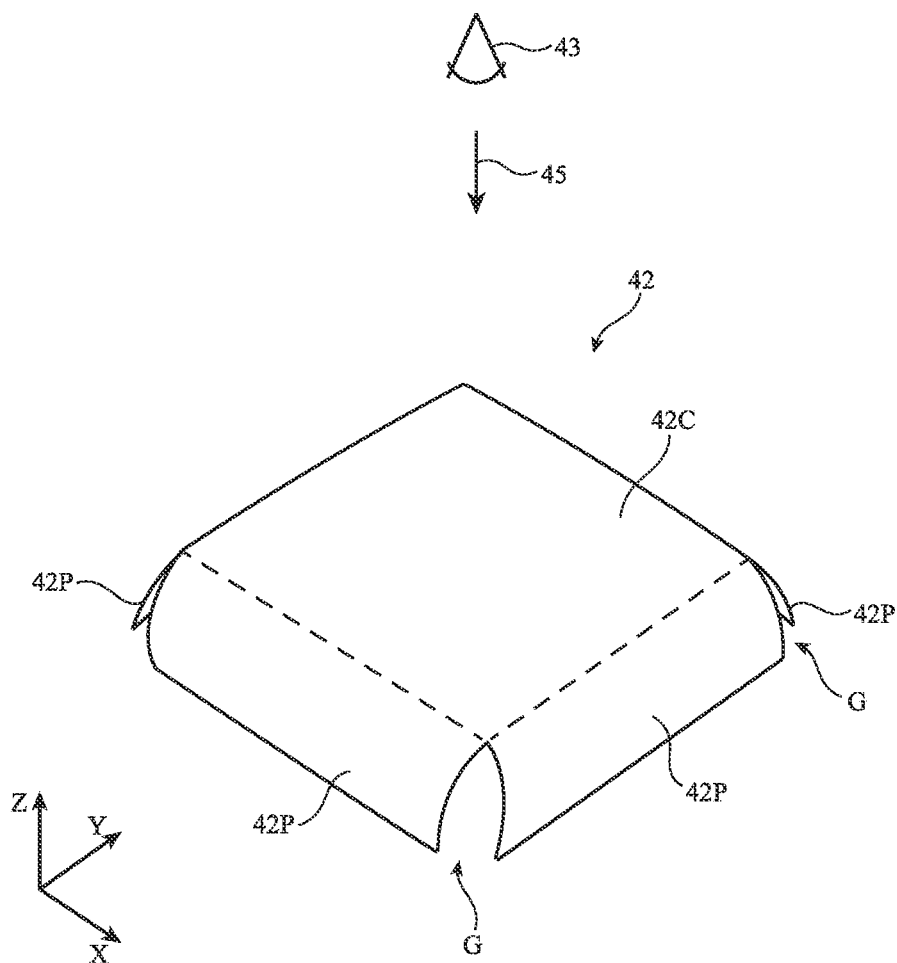
FIG. 4 is perspective view of an illustrative flexible display layer having bent edge protrusions in accordance with an embodiment.

Display layer 42 may have any suitable shape. With one illustrative configuration, display layer 42 has a central portion with peripheral edge protrusions that are bent. This type of arrangement is shown in FIG. 4. As shown in FIG. 4, display layer 42 may have a central portion such as central portion 42C. Central portion 42C may be planar or may have a curved surface profile. The outline (footprint when viewed from above) of central portion 42C may be rectangular or portion 42C may have an outline of other suitable shapes. In the example of FIG. 4, central portion 42C is square and has four peripheral edges. Elongated strip-shaped protrusions 42P may protrude from one or more of the four peripheral edges of portion 42C. For example, there may be protrusions 42P on the opposing left and right sides of portion 42C, there may be protrusions 42P on the opposing upper and lower edges of portion 42C, or there may be protrusions 42P or all four edges of portion 42C as shown in FIG. 4. Configurations in which there are other numbers of protrusions 42P (e.g., three protrusions, at least five protrusions, at least eight protrusions, etc.) may also be used.

As shown in FIG. 4, the peripheral edge portions of layer 42 may be bent so that the surface of each protrusion 42P has a curved profile. This enlarges the outline (footprint) of display layer 42 in the X-Y plane when viewed from above by viewer 43 in downward direction 45 (the −Z direction of FIG. 4) while at the same time covering internal components in device 10 with portions of display layer 42 when viewed from the side. Gaps G between sets of pixels on respective opposing edges of layer 42 may be present at the corners of display layer 42, but may, if desired, be reduced in size by additional bending of protrusions 42P. Colored ink (e.g., black polymer, polymer colored with a non-neutral colorant, etc.), light-emitting diodes, or other structures may be used in gaps G to help obscure gaps G from view. Bezel structures (e.g., housing structures such as portions of polymer or metal housing sidewalls) and other structures may also be used to visually block gaps G when the display of device 10 is viewed in direction 45.

Figure 5:
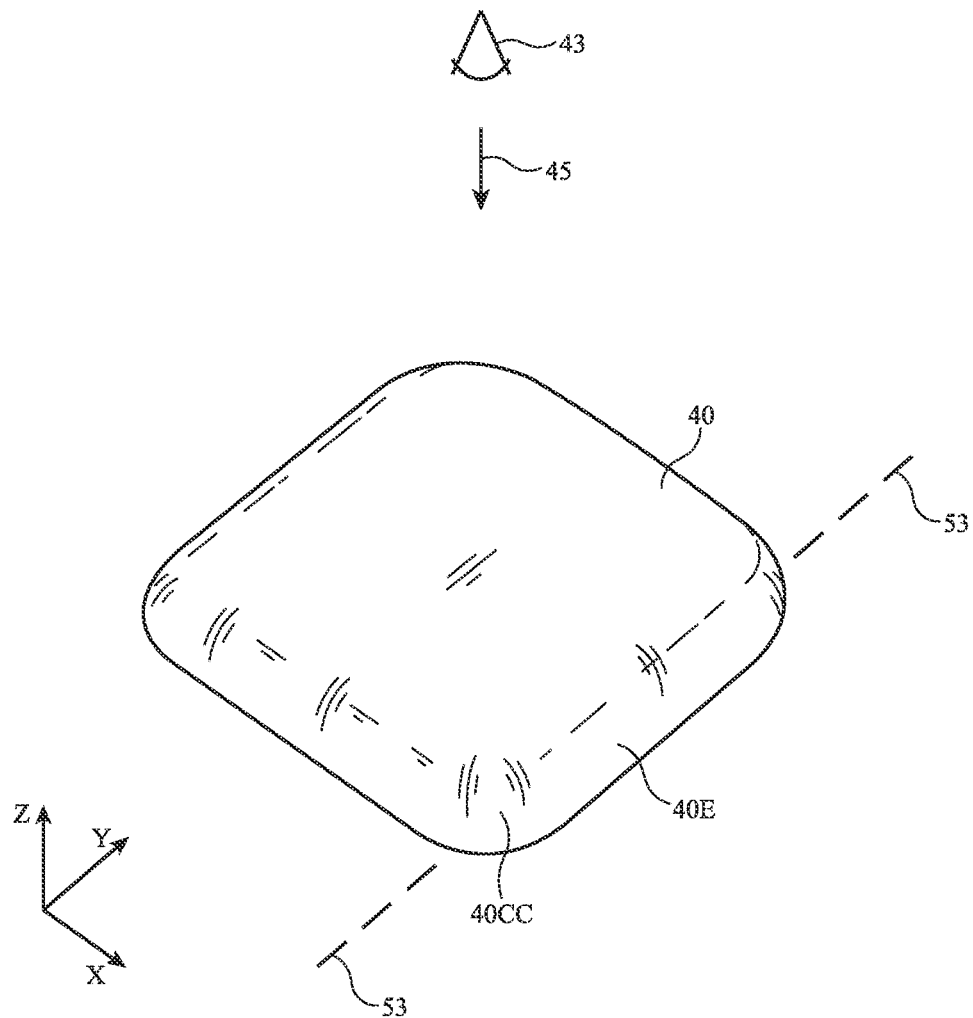
FIG. 5 is perspective view of an illustrative display cover layer in accordance with an embodiment.

Display 14 (and associated layers 40 and 42) may be rectangular (e.g., display 14 may have a rectangular shape with rounded corners), may be square (e.g., display 14 may have a square outline with rounded corners), may have a circular or oval outline, or may have other suitable shapes. A perspective view of display cover layer 40 in an illustrative configuration in which display cover layer 40 is square is shown in FIG. 5. As shown in FIG. 5, display cover layer 40 may have a square outline with rounded corners when viewed from above in direction 45. Display cover layer 40 may have a peripheral edge with four edge segments (e.g., top, bottom, left, and right peripheral edges), such as peripheral edges 40E. Edges 40E, which may sometimes be referred to as sidewall structures, sidewall segments, or side portions of display cover layer 40 may each have a curved cross-sectional profile (e.g., the surfaces of edges 40E may be curved).

If desired, device 10 (e.g., display cover layer 40) may have external surfaces with compound curvature. In the example of FIG. 5, device 10 has edge portions 40E with surfaces that each curve about respective edges axes such as axis 53. These portions (and the corresponding protrusions 42P of display layer 42 that are overlapped by edge portions 40E) extend along the straight sides of device 10 and are characterized by curved surfaces that can be flattened into a plane without distortion (sometimes referred to as developable surfaces). At the corner of device 10, display cover layer 40 has curved surface portions 40CC with compound curvature (e.g., a surface that can only be flattened into a plane with distortion, sometimes referred to as a surface with Gaussian curvature). Each of the four corners of device 10 may have this arrangement, if desired.

Figure 6:
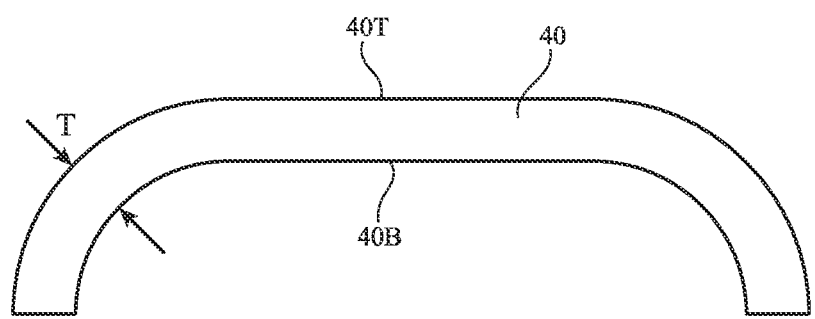
FIGS. 6 and 7 are cross-sectional side views of illustrative display cover layers in accordance with embodiments.

The central portion of the outer surface of display cover layer 40 may be planar, as shown by illustrative planar exterior surface 40T of display cover layer 40 in the cross-sectional side view of FIG. 6. Opposing inner surface 40B of display cover layer 40 may also have a planar profile in the center of display cover layer, as shown in FIG. 6. The thickness T of layer 40 may, if desired, be uniform across the surface of layer 40. Edge portions of layer 40 may have curved profiles as described in connection with FIG. 5.

Figure 7:
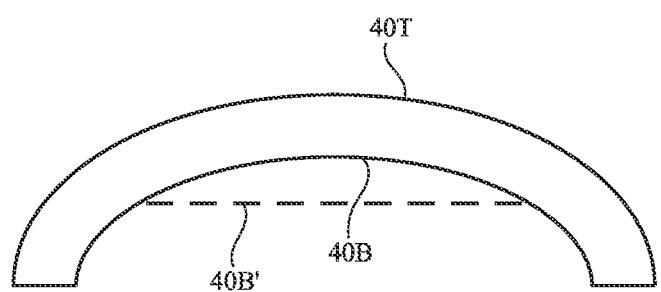

FIG. 7 is a cross-sectional side view of display cover layer 40 in an illustrative configuration in which the center of exterior surface 40T of display cover layer 40 has a curved profile. The center of opposing interior surface 40B of layer 40 may be curved (e.g., surface 40B may have a curved surface profile matching that of opposing outer surface 40T) or may have other shapes (see, e.g., the planar surface profile of illustrative inner surface 40B' in the center of layer 40).

Figure 8:
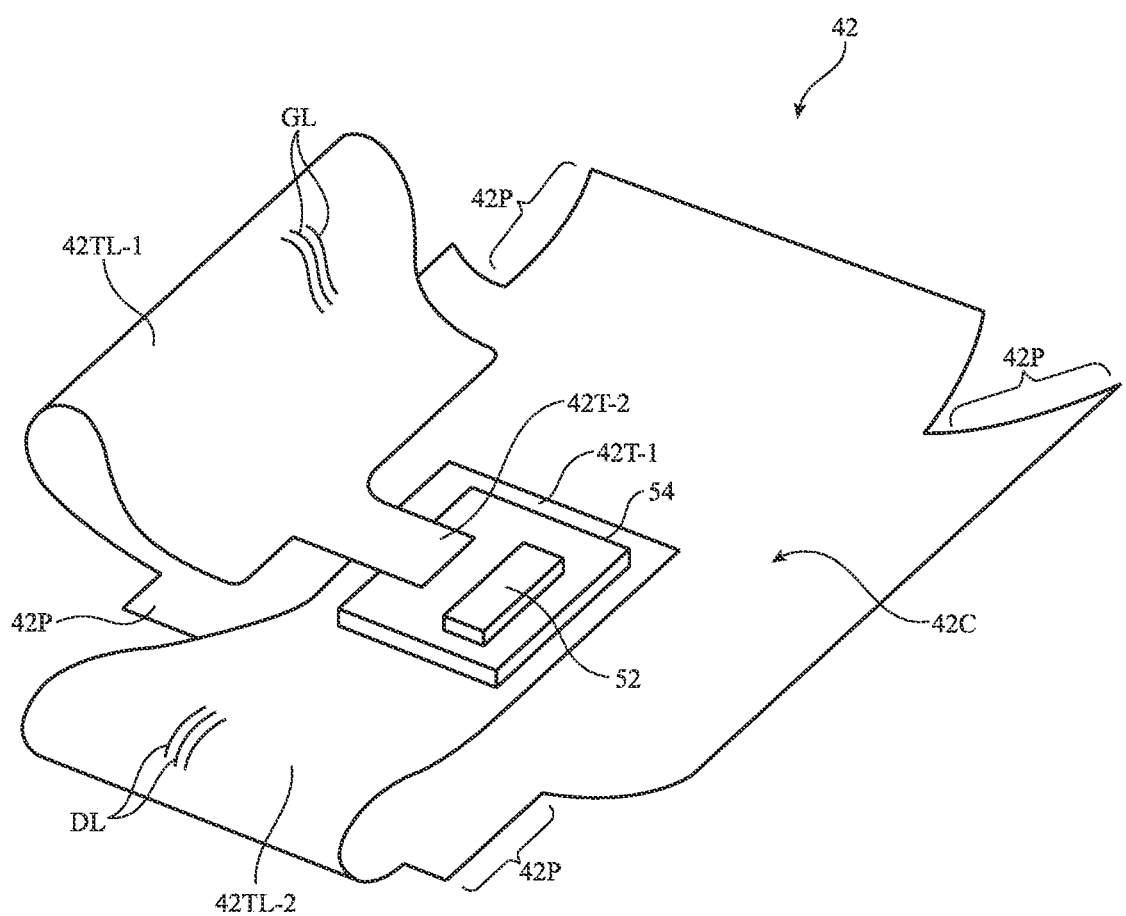
FIG. 8 is a rear perspective view of an illustrative flexible display in accordance with an embodiment.

FIG. 8 is a rear perspective view of display layer 42 in an illustrative configuration in which layer 42 has bent protruding inactive tail portions. Central portion 42C of display layer 42 may have a square shape or other rectangular shape (as an example). Edge protrusions 42P may extend along the four peripheral edges of the display and may have curved surface profiles, as described in connection with FIG. 4. Central portion 42C of display layer 42 and protrusions 42P of display layer 42 may have pixels configured to display images. Inactive tail portions such as portions 42TL-1 and 42TL-2 may extend from one or more of the edges of display layer 42. These tail portions are free of pixels, but contain signal paths such as gate lines GL and data lines DL that are coupled to display driver circuitry such as display driver circuitry 52 (e.g., one or more display driver integrated circuits, etc.). During operation, gate lines GL may be used to convey gate line signals (also sometimes referred to as gate signals, control signals, scan signals, emission control signals, etc.) onto control gates of transistors (e.g., thin-film transistors) in the pixels of display layer 42 while date lines DL convey corresponding data (pixel values) to the pixels of display layer 42.

In the illustrative configuration of FIG. 8, tail portion 42TL-1 extends from a first of protrusions 42P and tail portion 42TL-2 extends from a second of protrusions 42P. These tail portions may be folded under region 42C and coupled to printed circuit 54 at the rear of display layer 42. Printed circuits such as printed circuit 54 may be coupled to tail portions 42TL-1 and/or 42TL-2 using conductive adhesive, solder, or other conductive material. Display driver circuitry 52, connectors (for coupling to display driver circuitry on additional printed circuits), and/or other circuitry in device 10 may be mounted on printed circuit 54 and/or otherwise coupled to printed circuit 54 and/or display layer 42. Printed circuit 54 may be a rigid printed circuit (e.g., a printed circuit board formed from fiberglass-filled epoxy or other rigid printed circuit board material) or may be a flexible printed circuit. If desired, display driver circuitry 52 may be mounted directly on a portion of display layer 42 (e.g., using conductive adhesive, solder, etc.)

Figure 9:
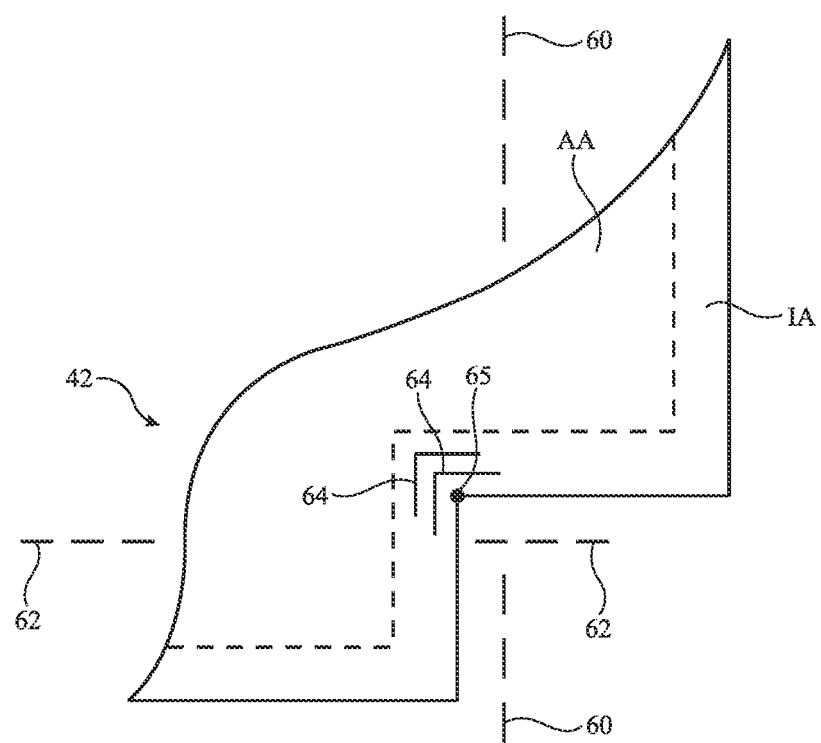
FIG. 9 is a top view of a corner portion of an illustrative flexible display in accordance with an embodiment.

The outermost border areas of layer 42 may form inactive areas of display 14. As shown in the illustrative corner portion of display layer 42 of FIG. 9, layer 42 may, for example, have a border such as inactive area IA that is free of pixels, but that contains metal traces forming signal paths 64 for carrying power signals, control signals, and/or data signals for display 14. Bend axes 60 and 62, about which respective protrusions 42P are bent, may be located away from corner 65 of the substrate of layer 42 and the pixels of layer 42 so that bending occurs in portions of paths 64 that are able to tolerate bending stress. As shown in FIG. 9, for example, bend axis 60 may be located to the right of corner 65, so that the strip-shaped protrusion running along the right edge of layer 42 of FIG. 9 experiences bending only at a location that is farther to the right than corner 65 and bend axis 62 may be located below corner 65, so that the strip-shaped protrusion running along the lower edge of layer 42 of FIG. 9 experiences bending only at a location that is farther down than corner 65. In this way, bending of the strip-shaped protrusions is limited to areas of layer 42 where compound curvature (spherical bent surfaces) will not be created. If desired, bend axis 60 may be located inboard of corner 65 (slightly to the left of corner 65 of FIG. 9) and bend axis 62 may be located inboard of corner 65 (slightly above corner 65). Configurations such as these in which the bend axes of the strip-shaped protrusions are located inboard of the corners of layer 42 may give rise to small amounts of compound curvature (spherical bending), but this can be acceptable in appropriate situations provided that the circuitry located in the area of compound curvature is not overly sensitive to stress.

Figure 10:
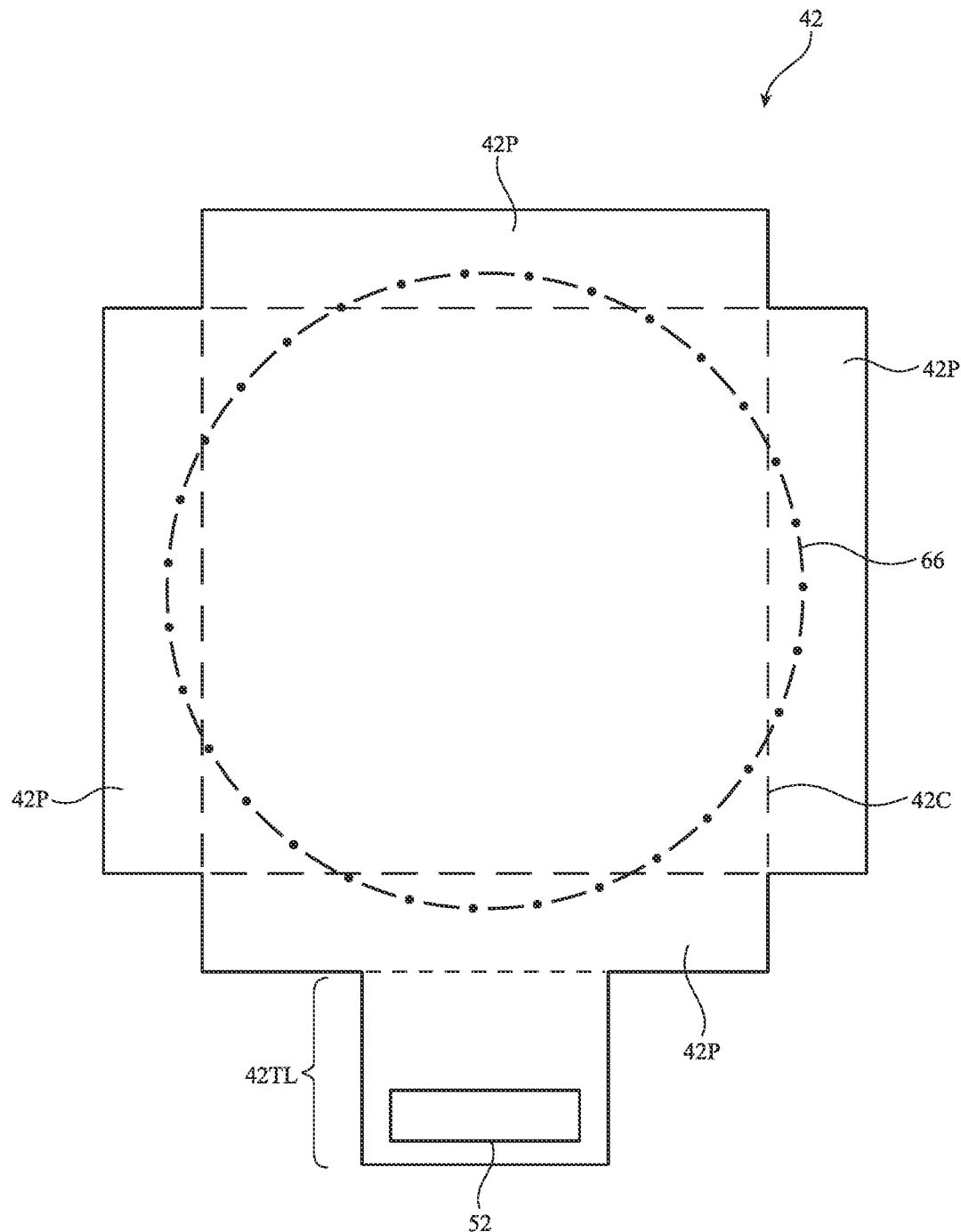
FIG. 10 is a top view of an illustrative flexible display with edge protrusions in accordance with an embodiment.

FIG. 10 is a top view of display layer 42 in an illustrative configuration in which central display layer region 42C is rectangular (e.g., square) and in which strip-shaped protrusions 42P extend along each of the four peripheral edges of central region 42C. Portions 42C and 42P contain pixels configured to display an image such as an image containing illustrative image content 66 (e.g., a circular clock face, clock hands, numerals, other content for a clock face, and/or other content).

Inactive tail portions of layer such as tail portion 42TL do not contain pixels and therefore do not display any part of image content 66. Even though corner portions of display layer 42 are missing, it is possible to display content such as illustrative image content 66 that extends onto one or more of protrusions 42P in addition to portion 42C. In some situations, such as when a visual element in a displayed image such as image content 66 is circular as shown in FIG. 10 or when the content in protrusions 42P includes dark background content that tends to visually blend with the missing corners of layer 42 (e.g., content that tends to visually blend with gaps G in FIG. 4), little or no content of interest needs to be omitted due to the absence of pixels in the corners of layer 42. For example, icons, text, clock face content, and/or other content can be centralized while portions of this content extend into the pixels of protrusions 42P.

The content being displayed on layer 42 can therefore be configured to minimize the impact of missing corner portions of display layer 42. For example, control circuitry 20 can be configured to display text on central portions of protrusions 42P without extending text or other potentially important information onto the areas of display 14 associated with the missing corners of layer 42. In some arrangements, icons, time information, date information, and/or other ancillary information may be displayed on protrusions 42P. Configurations in which background content (e.g., a solid color or pattern) is displayed in protrusions 42P may also be used.

Figure 11:
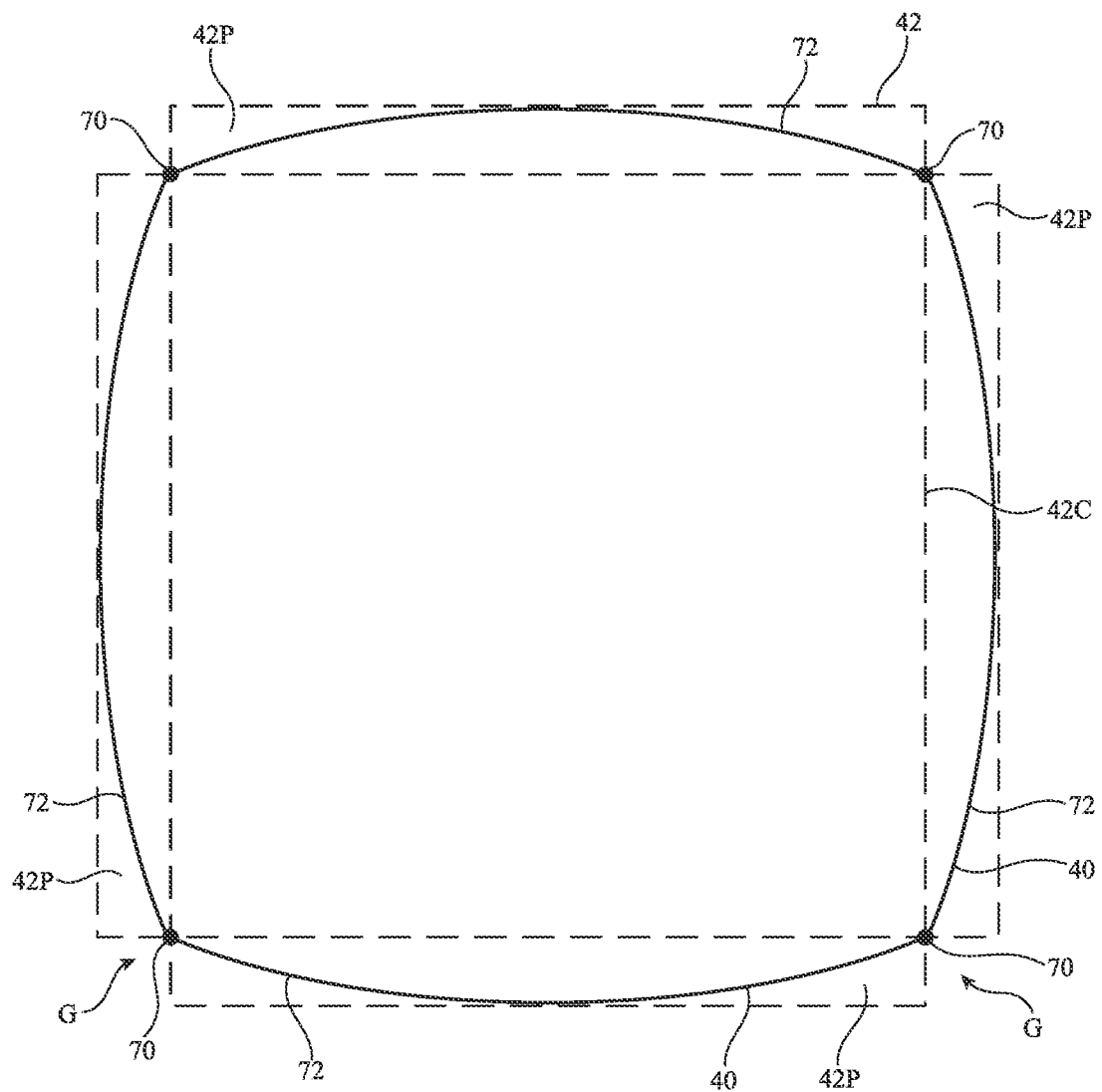
FIG. 11 is a top view of an illustrative display cover layer with a cushion shape in accordance with an embodiment.

If desired, display cover layer 40 may have a shape that minimizes overlap with the missing corners of display layer 42. Consider, as an example, illustrative display cover layer 40 of FIG. 11. In this example, display cover layer 40 has a cushion shape (sometimes referred to as a pillow shape or barrel shape). If desired, the corners 70 of display cover layer 40 may be aligned with the corresponding corners of layer 42 (see, e.g., corners 65 of layer 42 of FIG. 9). As shown in FIG. 11, the central portions of opposing upper and lower peripheral edges 72 of cushion-shaped layer 40 bow outwardly from central portion 42C and partially overlap respective upper and lower protrusions 42P. The central portions of opposing left and right peripheral edges 72 of layer 40 likewise bow outwardly from central portion 42C and partially overlap respective protrusions 42P on the left and right sides of display layer 42. In this way, some or all of the central portion of each protrusion 42P may be covered with a corresponding bowed out edge portion of display cover layer 40 (e.g., while little or none of the missing corners of display layer 42 are covered with layer 40). This helps hide gaps G while enhancing the area of display layer 42 that is available for displaying image content.

Figure 12:
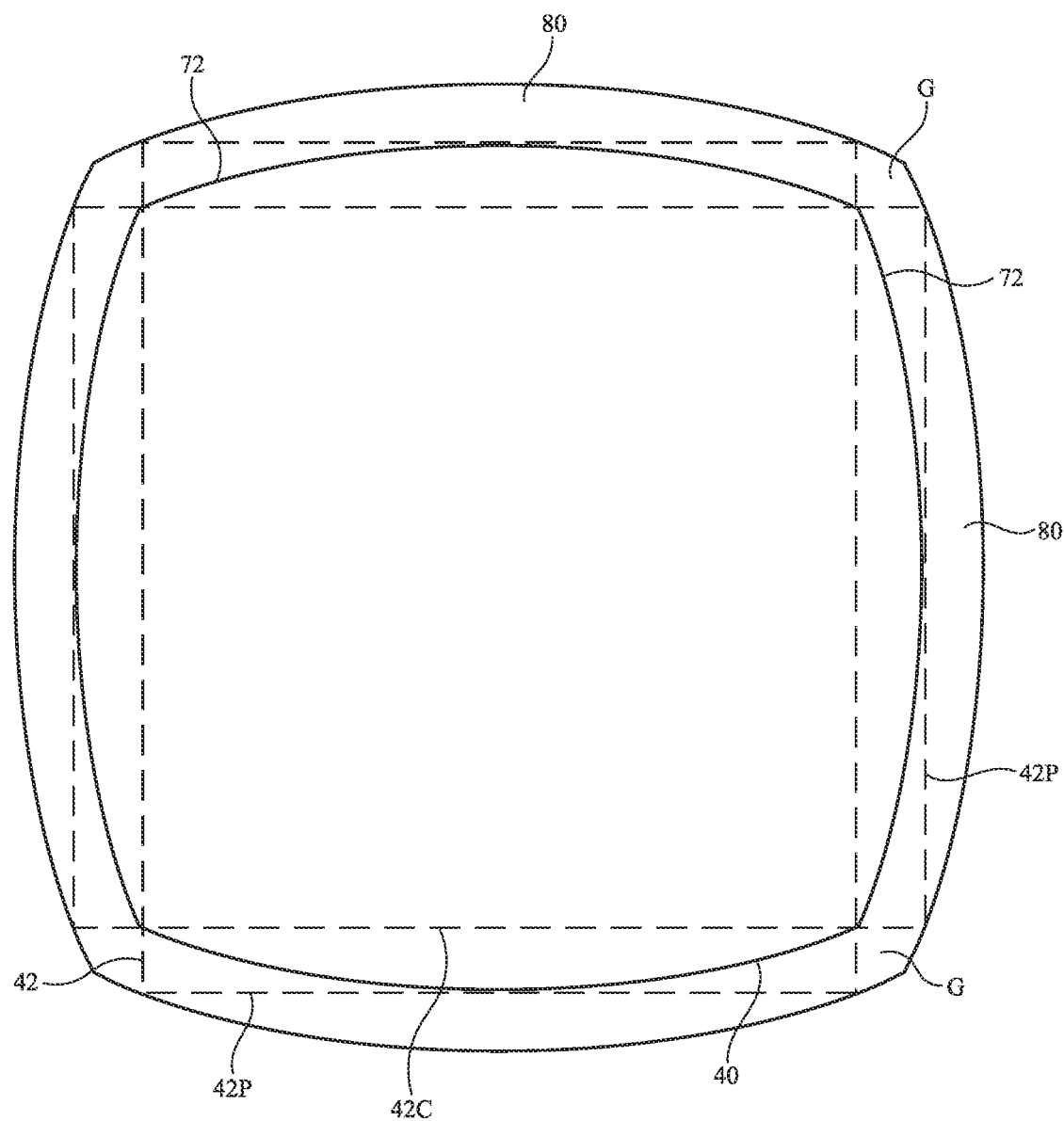
FIG. 12 is a top view of an illustrative electronic device with a display cover layer of the type shown in FIG. 11 in accordance with an embodiment.

As shown in FIG. 12, a portion of the housing of device 10 (e.g., bezel 80 of FIG. 12 or other housing structures, which may be formed from metal or other material) may be formed around the peripheral edge of display cover layer 40, thereby helping to hide the missing corners (gaps G) of display layer 42 from view.

Figure 13:
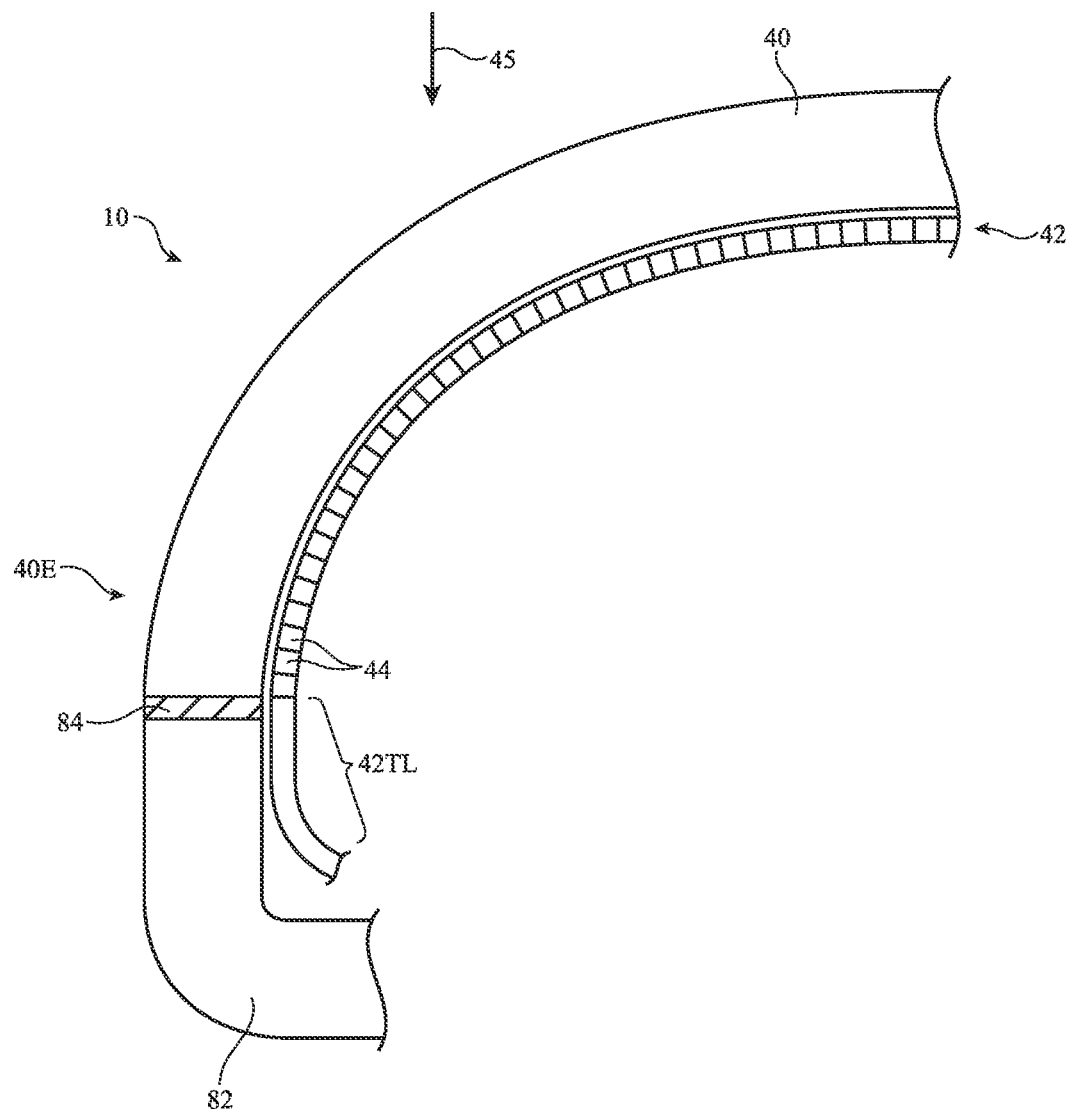
FIGS. 13 and 14 are cross-sectional side views of edge portions of illustrative electronic devices in accordance with embodiments.

If desired, display layer 42 may be bent sufficiently that inactive tail portions of layer 42 are hidden from view from the front of device 10. Consider, for example, illustrative device 10 of FIG. 13. In the example of FIG. 13, display layer 42 has an active area with pixels 44 from which inactive tail portion 42TL extends downwardly into the interior of device 10. Display cover layer 40 may have a curved edge portion that is coupled to housing walls 82 using adhesive 84 or other mounting structures. Housing walls 82 may, if desired, be formed from opaque material such as metal or transparent material that is covered with opaque ink or other opaque coating layers. When device 10 is being viewed from the side, inactive tail portion 42TL may be hidden from view from the exterior of device 10 by housing walls 82. When device 10 is being viewed from above in direction 45, tail portion 42TL may be partially or completely blocked from view by housing walls 82 and the vertical or nearly vertical arrangement of the exterior surface of layer 40 along edge portion 40E.

Figure 14:
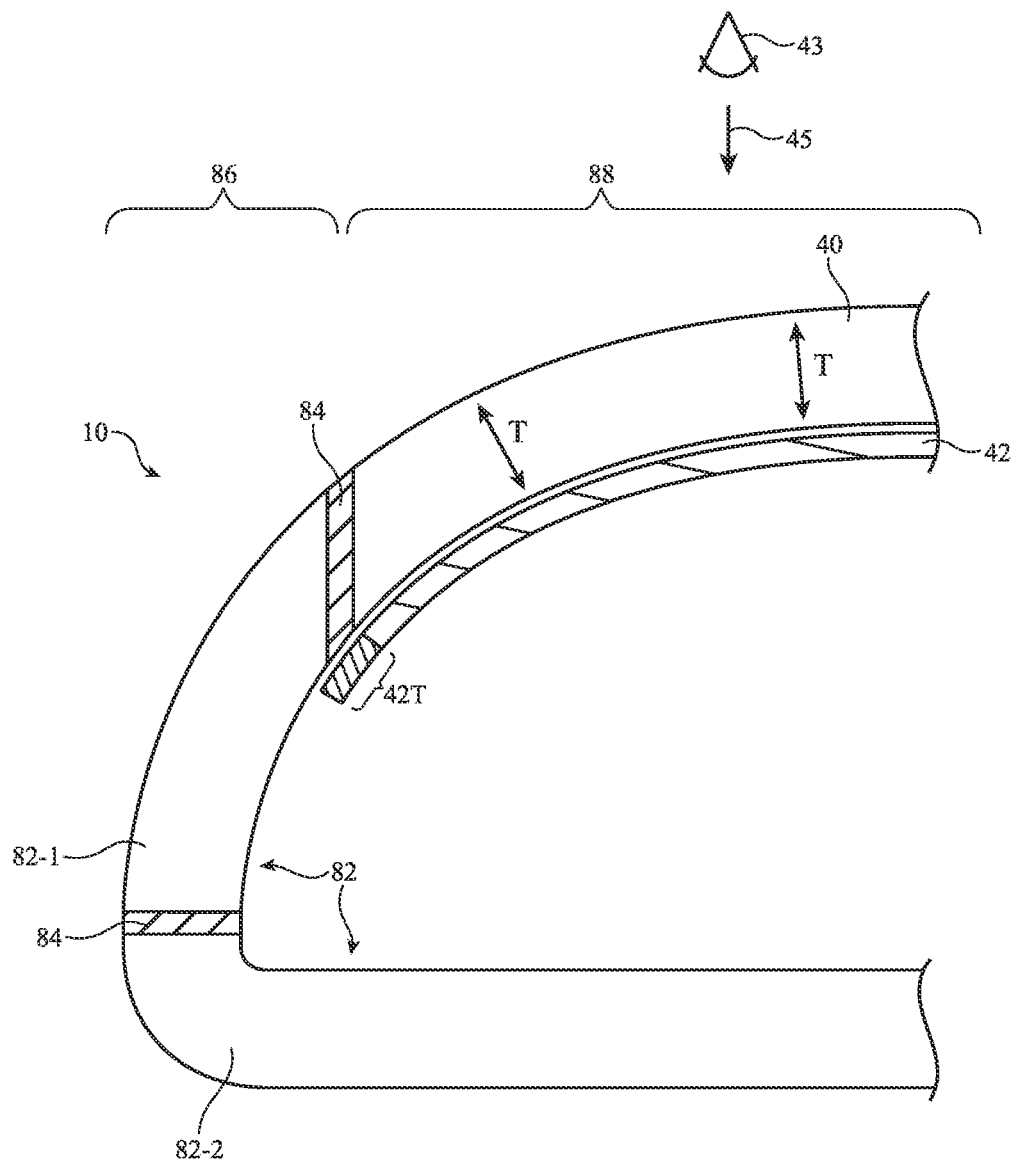

Another illustrative configuration for device 10 is shown in FIG. 14. As shown in the example of FIG. 14, the housing of device 10 may have portions on the rear and side of device 10. For example, a housing wall such as rear housing wall 82-2 may extend over some or all of the rear face of device 10 and a metal sidewall structure in the housing of device 10 such as sidewall 82-1 may extend over some or all of the edge of device 10. Housing structures such as walls 82-1 and 82-2 may be formed from opaque material such as metal, opaque polymer, etc. or may be formed from transparent materials covered with opaque coatings (as examples).

Adhesive or other material 84 may be used in coupling display cover layer 40 to housing portion 82-1 and in coupling housing wall portions 82-1 and 82-2 together. Display layer 42 may be configured so that the active portion of layer 42 is visible in direction 45 by viewer 43 while inactive tail portion 42TL extends behind opaque structures in device 10 such as sidewall 82-1. Due to the curvature of display cover layer 40 and wall 82-1 near the edge of device 10, the active area of display 14 (e.g., the pixels of display layer 42) may be viewed in direction 45 through display cover layer 40 while inactive tail 42TL is blocked from view. If desired, the outermost peripheral portion of housing sidewall 82-1 may be configured to be nearly vertical to help maximize the area of device 10 in which images are displayed (e.g., area 88) relative to the width of the inactive border areas of device 10 in which no images are displayed (e.g., area 86).

Figure 15:
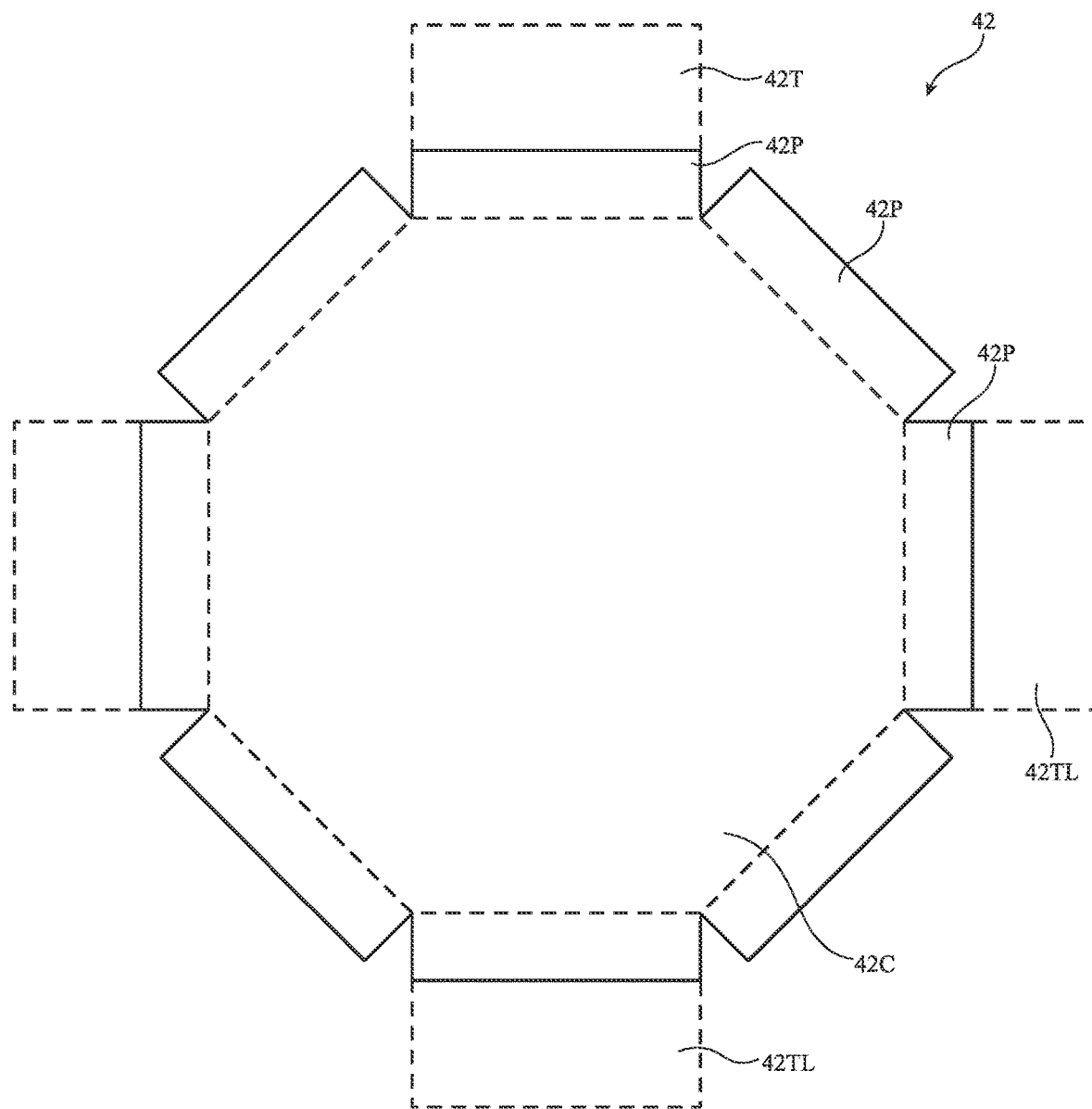
FIG. 15 is a top view of an illustrative flexible display with an octagonal central portion in accordance with an embodiment.

If desired, device 10, display cover layer 40, and display layer 42 may have non-rectangular outlines. For example, device 10, display cover layer 40, and display layer 42 may have an octagonal outline or other outline with fewer than four edges or more than four edges (and/or with any number of edges that include straight and/or curved segments). In the top view of display layer 42 of FIG. 15, display layer 42 has an illustrative octagonal layout with eight strip-shaped protrusions 42P, each of which extends along a corresponding one of eight straight segments of the periphery of octagonal central portion 42C of display layer 42. Protrusions 42P may be bent out of the plane of central portion 42C of layer 42 and may have curved surface profiles. Inactive tail portions 42TL may extend outwardly from one or more of protrusions 42P and may contain signal paths coupled to display driver circuitry, as described in connection with FIG. 8. Although the example of FIG. 15 involves the use of eight edge, display layer 42 may have any suitable number of edges. For example, display layer 42 may have more than eight edges (e.g., at least nine edges, at least ten edges, at least 12 edges, at least 16 edges, fewer than 32 edges, etc.). Arrangements with more edges may help form a display footprint that is closer to an ideal circular shape, but may potentially reduce the amount of active area on the bent protrusions that is available for displaying images.

The foregoing is merely illustrative and various modifications can be made to the described embodiments. The foregoing embodiments may be implemented individually or in any combination.

What is claimed is:

1. A wristwatch, comprising:
   a flexible display having a planar central portion and first and second bent edges separated by a gap;
   a display cover layer that overlaps the flexible display; and
   a structure that hides the gap from view, wherein the structure is selected from the group consisting of: ink, light-emitting diodes, and a housing structure.

2. The wristwatch defined in claim 1 wherein the flexible display comprises pixels on the planar central portion and the first and second bent edges.

3. The wristwatch defined in claim 2 wherein the pixels on the first and second bent edges are configured to display content that blends in with the gap.

4. The wristwatch defined in claim 1 wherein the display cover layer overlaps the planar central portion and the first and second bent edges without overlapping the gap.

5. The wristwatch defined in claim 1 wherein the display cover layer has rounded corners with compound curvature.

6. The wristwatch defined in claim 1 wherein the display cover layer has a planar portion overlapping the planar central portion of the flexible display and has curved edges overlapping the first and second bent edges of the flexible display.

7. The wristwatch defined in claim 1 wherein the flexible display comprises a flexible organic light-emitting diode display layer, the wristwatch further comprising:
   a metal housing coupled to the display cover layer;
   a wrist strap coupled to the metal housing; and
   wireless transceiver circuitry configured to transmit and receive wireless signals.

8. The wristwatch defined in claim 1 wherein the display cover layer has a cushion shape.

9. The wristwatch defined in claim 1 wherein the planar central portion has a non-rectangular shape.

10. The wristwatch defined in claim 1 wherein the first bent edge comprises an inactive portion that is hidden from view by an opaque housing sidewall.

11. A wristwatch, comprising:
    a flexible display having an array of pixels that includes first and second groups of pixels separated by a gap;
    a display cover layer that overlaps the flexible display; and
    an opaque structure that hides the gap from view, wherein the first and second groups of pixels are configured to display content that visually blends in with the gap.

12. The wristwatch defined in claim 11 wherein the flexible display comprises first and second bent edges and wherein the first group of pixels is located on the first bent edge and the second group of pixels is located on the second bent edge.

13. The wristwatch defined in claim 12 wherein the first bent edge has an inactive area that is hidden by a housing wall.

14. The wristwatch defined in claim 11 wherein the display cover layer has a planar central portion and first and second curved portions that respectively overlap the first and second groups of pixels.

15. The wristwatch defined in claim 14 wherein the display cover layer has a corner with compound curvature between the first and second curved portions.

16. The wristwatch defined in claim 11 wherein the opaque structure comprises black ink.

17. The wristwatch defined in claim 11 wherein the opaque structure comprises a metal housing sidewall.

18. A wristwatch, comprising:
- a flexible display having a planar central portion and first and second bent edges separated by a gap, wherein the flexible display comprises pixels on the planar central portion and the first and second bent edges; and
- a display cover layer that overlaps the planar central portion and the first and second bent edges without overlapping the gap.

19. The wristwatch defined in claim 18 further comprising an opaque structure that hides the gap from view, wherein the pixels on the first and second bent edges are configured to display content that blends in with the opaque structure.

20. The wristwatch defined in claim 19 wherein the display cover layer comprises first and second curved portions, wherein the pixels on the first bent edge are configured to display the content through the first curved portion, and wherein the pixels on the second bent edge are configured to display the content through the second curved portion.

\* \* \* \* \*